United States Patent [19]
Combettes et al.

[11] Patent Number: 4,978,916
[45] Date of Patent: Dec. 18, 1990

[54] METHOD FOR MAGNETICALLY CHARACTERIZING THE RECORDING LAYER OF A MAGNETIC INFORMATION CARRIER, AND APPARATUS FOR PERFORMING THE METHOD

[75] Inventors: Christian Combettes, Bercheres S/Vesgre; René Lefebvre, Montigny Le Bretonneux, both of France

[73] Assignee: Bull S.A., Paris, France

[21] Appl. No.: 371,532

[22] Filed: Jun. 26, 1989

[30] Foreign Application Priority Data

Jun. 29, 1988 [FR] France .................. 88 08773

[51] Int. Cl.$^5$ ............ G01R 33/12; G11B 27/36; G11B 5/004
[52] U.S. Cl. ........................ 324/212; 360/25
[58] Field of Search .......... 324/210, 212; 360/25, 360/31, 53; 367/53

[56] References Cited

U.S. PATENT DOCUMENTS 3,686,682 8/1972 Behr et al. .................... 340/174.1 B
3,781,835 12/1973 Dion et al. .................... 340/174.1 B

FOREIGN PATENT DOCUMENTS 2522857 9/1983 France .
0088675 5/1983 Japan .................... 324/212
0123783 7/1985 Japan .................... 324/212
0664134 5/1979 U.S.S.R. .................... 324/212

OTHER PUBLICATIONS

Hewlett-Packard Journal, vol. 36, No. 11, (Nov. 1985), pp. 11-21, "Dynamic Testing of Thin Film Magnetic Recording Discs", Amstelveen, N. L., and Hodges, J. et al.

Primary Examiner—Gerard R. Strecker
Attorney, Agent, or Firm—Kerkam, Stowell, Kondracki & Clarke

[57] ABSTRACT

A method and an apparatus are disclosed for determining or defining a magnetic information carrier (TAMB) which includes a plurality of tracks P each having a synchronization index (IND). In the method, (1) the synchronization index (IND) is located, which makes it possible to initialize (pulse $I_N$) the sequence ($SEQ_1$, $SEQ_2$, ... ) of the following successive operations, which are repeatable p times; (2) the entire surface of the track is first erased; (3) next, on this same surface, a succession of magnetic domains ($A_i$, $A_{i+1}$, $A_{i+2}$, ...) is written; (4) at predetermined sampling times ($t_n$, $t_{n+1}$...), with a predetermined sampling period $T_E$, a signal S is read, which is a function of the magnetization inside each of the domains read at these times; and (5) the values of the current I and signal S are memorized.

14 Claims, 6 Drawing Sheets

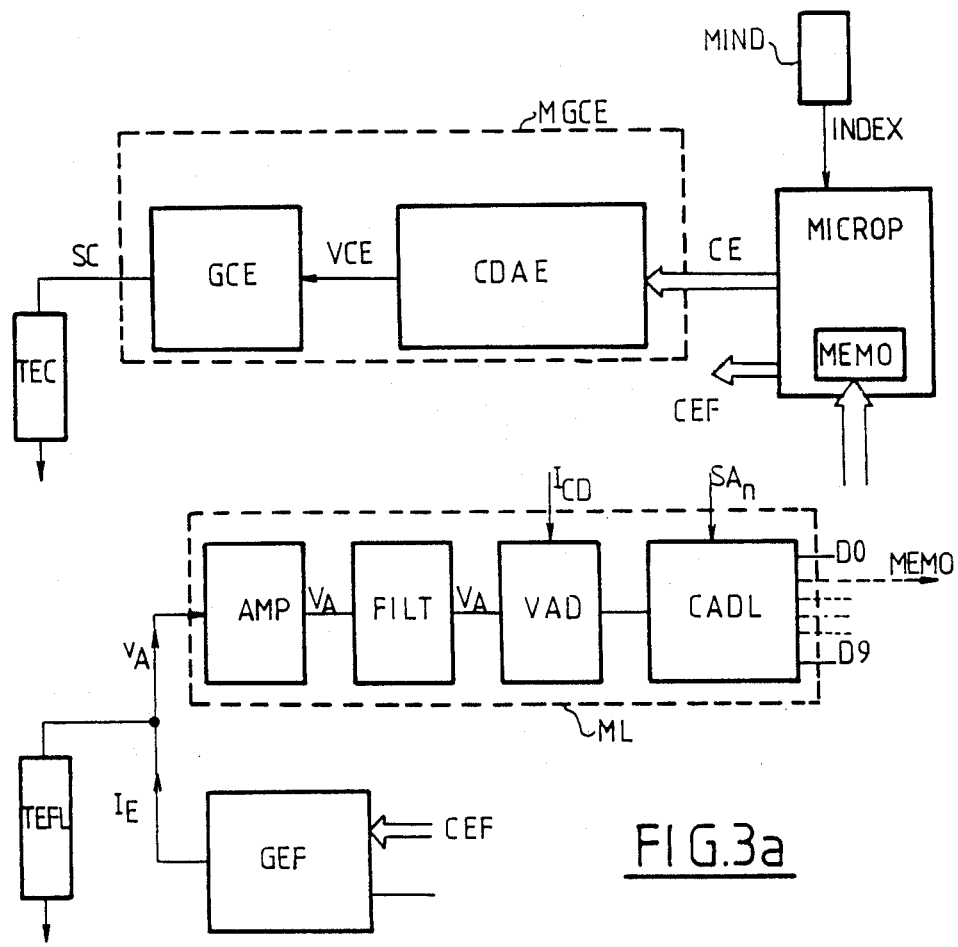
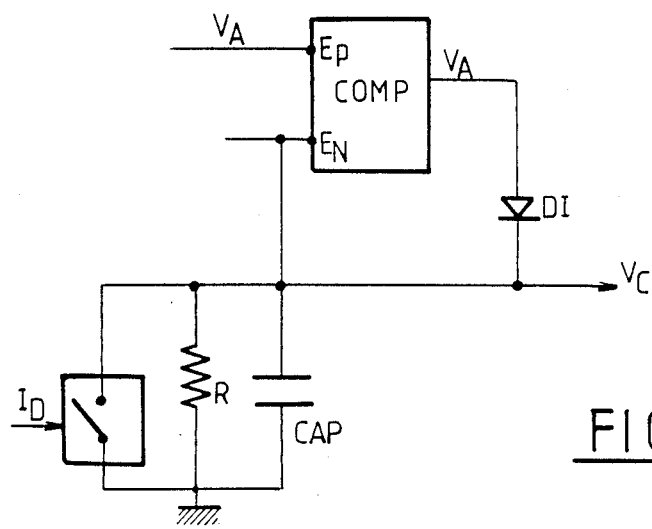
FIG.3a
FIG.3b

METHOD FOR MAGNETICALLY CHARACTERIZING THE RECORDING LAYER OF A MAGNETIC INFORMATION CARRIER, AND APPARATUS FOR PERFORMING THE METHOD

FIELD OF THE INVENTION

The present invention relates to a method for magnetically determining or defining the recording layer of a magnetic information carrier, and to apparatus performing the method. The invention is more particularly applicable to determining or defining the magnetic drums of magnetographic printers or the magnetic disks of disk memories.

BACKGROUND OF THE INVENTION

Magnetographic printers are well known, and are preferred in information processing systems that require printing machines capable of printing highly legible characters at extremely high speeds (several thousand or even ten thousand lines per minute).

Such a printer is described in French Patent No. 2,522,857, filed on Mar. 3, 1982. This type of magnetographic printing machine (also known as a non-impact magnetic printer) includes a magnetic recording carrier comprising a magnetic drum, in turn formed by a magnetic shunt comprising its central portion, on which a magnetic recording layer is deposited. The machine also includes a set of magnetic recording heads, placed one beside the other parallel to the axis of rotation of the drum. These magnetic heads make it possible to create magnetized domains or points on the surface of the recording layer of the drum, which is driven by a roller bearing with uniform rotation. Magnetized zones comprising a set of magnetized domains are thus formed; the shape of the zones correspond to that of the characters to be printed. These magnetized domains are then coated with particles of a powdered magnetic pigment by means of a developer device. This pigment for instance comprises magnetic particles coated with a resin. The resin tends to melt when heated and is affixed to the printing paper to which it is applied. The magnetic pigment adheres to the sets of magnetic domains as defined above, forming a deposit of particles on the drum surface. These particles are then transferred to a sheet of paper pressed against the drum by a transfer roller. The particles that remain on the drum are then lifted off by an erasing device.

In view of the above explanation, it can be appreciated that in a magnetographic printer, the magnetic drum is an essential device. In fact, the printing quality of the characters and the homogeneity of printing over the entire surface of the printing paper depends on the magnetic properties of this drum and on their homogeneity over its entire surface.

Hence it is particularly important to be able to assure that in the course of the various successive manufacturing operations for producing the drum, the drum will have magnetic properties over its entire surface that conform to reference norms arrived at in advance, for example by experimentation. These norms define the standard magnetic characteristics that the drum must have in order for the printing quality to be correct (that is, the curve of primary magnetization track by track, the resulting permeability, and the coercive field, all of them being over the entire surface of the drum).

The terms "determining", "defining", and "characterizing" may be used interchangeably when referring to ascertaining the magnetic characteristics of a drum, layer or film.

It is important to be able to monitor the magnetic characteristics of a drum as soon as the operations of manufacturing the drum are completed, and to do so before the drum is coated with a layer for mechanical protection against shock and corrosion (this layer is for instance of chromium).

Under current circumstances, the procedure is as follows: At the same time as the magnetic recording layer is deposited on the magnetic shunt comprising the central portion of the drum, a representative sample of the drum is made up. This sample comprises a specimen made of brass, on which a magnetic material is deposited that is strictly identical (in terms of both the constituent material and the thickness) to that comprising the recording layer of the drum. The various magnetic characteristics of this sample are measured, for instance, with a commercially available magnetometer or a conventional flux meter. Verification is done as to whether these properties do conform to the above-defined reference norms. If so, then the drum is sent to a chromium-plating station, where it is coated with its protective chromium layer.

It will be understood that the characterization of this sample cannot precisely reflect the magnetic properties of the drum in its entirely. It often happens, moreover, that on returning from the chromium-plating station the magnetic drum is found not to have the required magnetic properties over its entire surface for assuring correct printing quality. It is then rejected, which is very expensive.

OBJECT AND SUMMARY OF THE INVENTION

The present invention makes it possible to overcome these disadvantages by providing an apparatus with which the magnetic recording layer of a magnetic printing drum can be determined as soon as the manufacturing operations for it are completed (prior to chromium-plating). This takes place over the entire surface of the recording layer of the drum and is very rapid. It makes it possible to learn the characteristics of the recording layer over the entire surface of the drum, and to verify whether these characteristics are homogeneous, not only on a predetermined track of the drum but over all the recording tracks of the drum.

If a drum lacks the required magnetic characteristics with respect to the reference norms, this invention makes it possible to return the drum to the manufacturing operation, and consequently to avoid rejecting a certain number of magnetic drums as was the case in the prior art. This makes for substantial economies, which makes it possible to reduce the average cost price of the drums appreciably. Hence this invention relates to the process of improving the quality of drum manufacture.

It will be understood that the apparatus according to the invention is equally useful to industrial manufacturing services producing the magnetic drum and to services providing maintenance for it.

According to the invention, the method for magnetically determining the recording layer of a magnetic information carrier, where the information is recorded on a plurality of tracks each having an index of synchronization, is characterized in that for each support track P:

(1) the synchronization index is located, which makes it possible to initialize the sequence S of the successive operations 2-5 that follow, which are repeatable p times, where p is an integer;

(2) the recording layer is first erased in such a manner as to neutralize its magnetic state, over the entire surface of the track P, (3) on this same surface, a succession of magnetic domains is then written by means of a magnetic field produced by a periodic writing current SC, of a predetermined amplitude I and a predetermined frequency $f_E$;

(4) at predetermined sampling times, separated by a predetermined sampling period $P_E$ greater than the period T of the writing current SC, a signal S is read, which is a function of the magnetization inside the domains in the series;

(5) the values of the current I and the signal S are memorized.

The invention also relates to the apparatus for performing the method defined above; the apparatus includes:

means for locating the synchronization index emitting an initialization signal of the sequence S when this index is located;

a transducer for erasing the magnetic layer;

a transducer for writing domains on the track connected to generating means of said periodic current;

a transducer for reading the domains recorded on the track, the analog signal of which is transmitted to reading means which furnish the signal S at said sampling times;

means for memorizing the values S and I connected to said current generating means and reading means.

Further characteristics and advantages of the present invention will become apparent from the ensuing detailed description given by way of example, in conjunction with the accompanying drawings.

BRIEF DESCRIPTION OF THE DRAWINGS

FIG. 3, including FIGS. 3a and 3b, is a more detailed view of FIG. 1, showing in particular how the means for generating the writing current with which the writing transducer is applied and the reading means furnishing the signal S are constituted;

DESCRIPTION OF THE PREFERRED EMBODIMENTS

Figure 1:
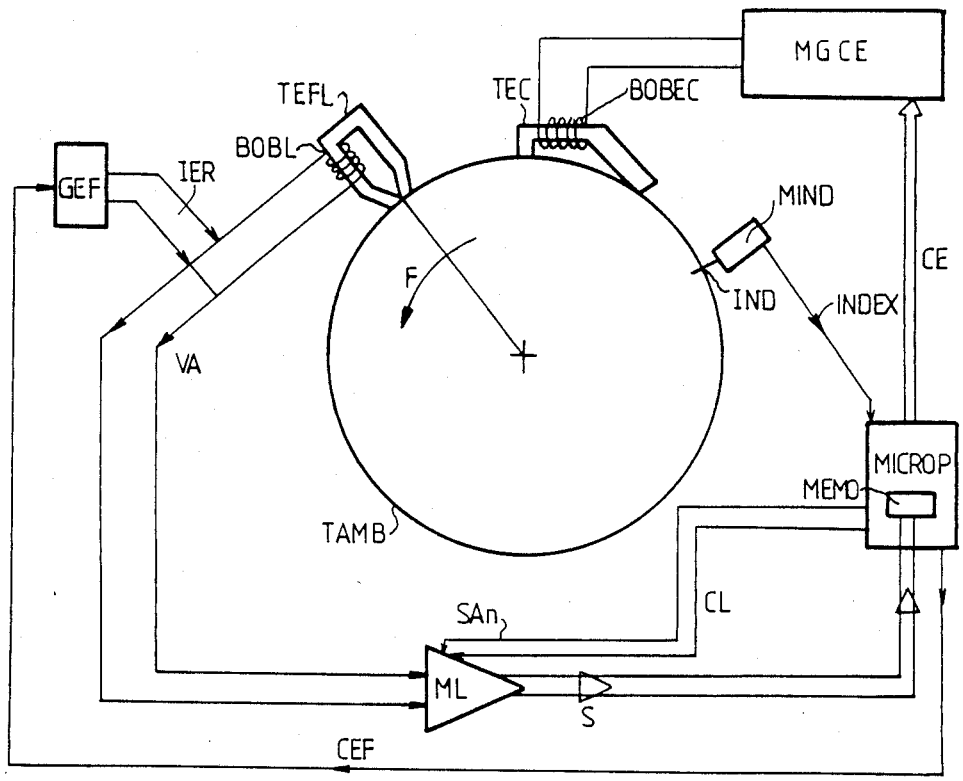
FIG. 1, in a simplified diagram, shows the various essential constituent elements of the apparatus for performing the method according to the invention, more commonly known as a dynamic magnetometer.

FIG. 1 shows the various essential constituent elements of a dynamic magnetometer according to the invention, intended for magnetically characterizing the magnetic drum TAMB.

The dynamic magnetometer includes:

means MIND for locating the synchronization index IND placed on each recording track of the drum;

a transducer TEC for writing information (magnetic domains) one each track P of the drum TAMB, connected to means MGCE for generating a writing current SC;

an erasure and reading transducer TEFL assuring on the one hand the function of a transducer for erasing the information recorded on each track of the magnetic recording layer of the drum, and on the other hand the function of a transducer for reading the information recorded on each track P by the writing transducer TEC;

reading means ML connected to the reading transducer TEFL, which furnish a signal S, this signal being transmitted to a memory MEMO, which also contains the value of the intensity of the writing current SC.

The memory MEMO is contained in a programmable control device MICROP, which is preferably a microprocessor and which moreover controls the operations of erasure, writing and reading of the information, which are respectively performed by the transducers TEFL, TEC, and TEFL.

The drum TAMB is a cylindrical drum of circular cross section, the magnetic recording layer of which is embodied by an alloy of cobalt, nickel and phosphorus (Co-Ni-P) approximately 25 μm in thickness deposited on a substrate of copper 0.8 μm in thickness, which in turn is deposited onto a magnetic shunt of an iron and silicon alloy Fe-Si 100 mm in diameter.

Each recording track P of the drum TAMB contains a synchronization index IND making it possible to arbitrarily locate the beginning of each track P. It will be understood that all the indexes IND of the tracks of the drum TAMB are aligned on the same generatrix of the drum. They are for instance made up of optical reference marks inscribed on the surface of the drum.

The locating means MIND are for example constituted of photoelectronic transducers furnishing an electric pulse $I_N$ (see FIG. 6) as soon as the index IND of a given track P moves past them.

The erasing and reading transducer TEFL preferably comprises an inductive head of the type of that currently used in magnetic tape drives, and manufactured for example by the company known as Etablissements Vedette in Savern, 6700 France, and sold by the Bull Corporation, item No. 993 609 000-01. This inductive head TEFL accordingly includes a winding BOBL.

When the transducer TEFL functions as an erasing transducer, this winding BOBL is supplied by a generator GEF of an erasing current $I_{ER}$, which in turn is controlled by the programmable control device MICROP.

When it functions as a reading transducer, its winding BOBL furnishes an analog signal $V_A$ to the reading means ML, which is converted into a digital signal S that is transmitted to the memory MEMO of the microprocessor MICROP. The reading means ML are controlled by a reading control signal CL transmitted by the programmable control device MICROP by modalities to be described hereinafter.

Figure 2:
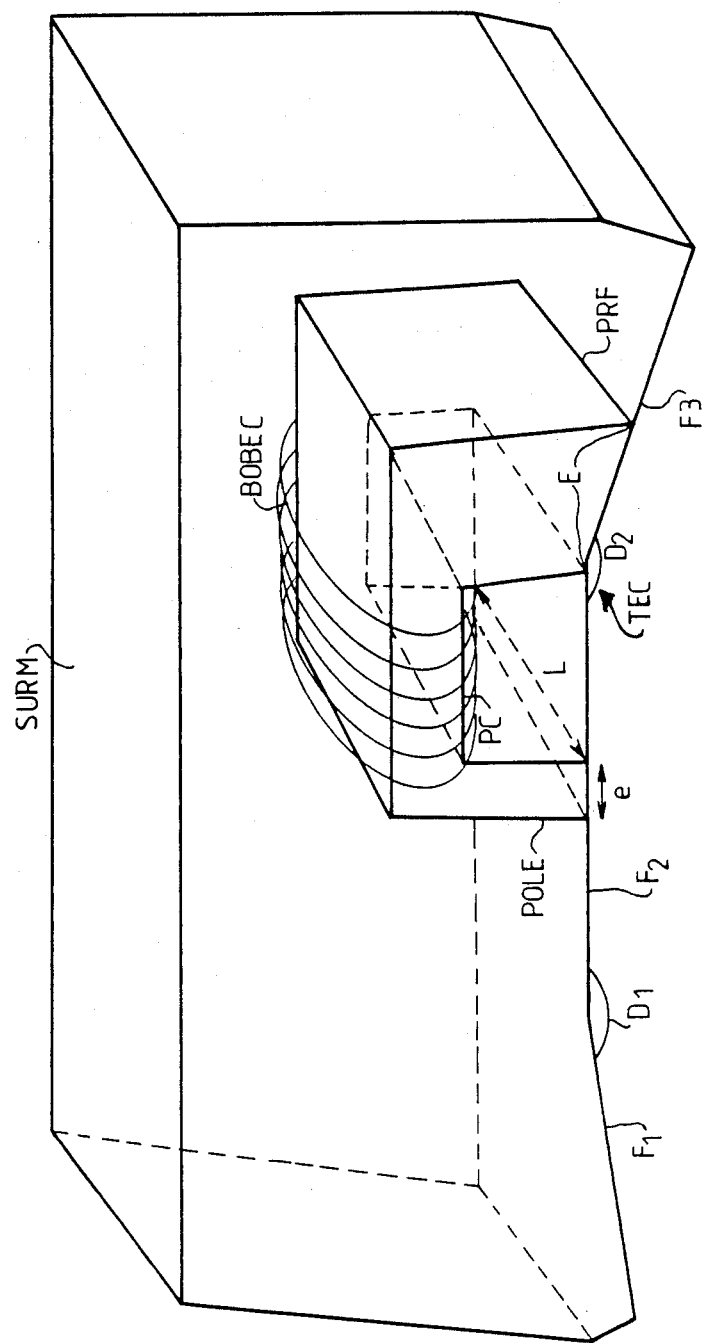
FIG. 2 is a perspective view showing how the writing transducer of the apparatus according to the invention is embodied.

The writing transducer TEC is a transducer of the inductive type including a winding BOBEC. A preferred embodiment of this transducer is shown in FIG. 2. This transducer TEC is of the type described in the aforementioned French Patent No. 2.522.857. It is of the shoe type with perpendicular recording, and accordingly includes a writing pole and a flux return pole PRF. The thickness e of the writing pole POLE measured parallel to the direction of travel of the drum tracks past the transducer is very substantially less than the thickness E of the flux return pole PRF, such that once the information has been written by the writing pole POLE, the information is not perturbed by the flux return pole PRF. The cross section of the writing pole POLE is substantially rectangular and has a width L. The order of magnitude of the dimensions e and L is as follows: 0.1 mm for e and 4.8 mm for L. In a known manner, the magnetic circuit of the writing transducer TEC comprises a material of high magnetic permeability. The winding BOBEC is disposed in the central portion PC of the magnetic circuit that connects the writing pole POLE to the flux return pole PRF.

The writing transducer TEC is preferably embedded in a duplicate molding SURM having a width greater than the width of the transducer TEC, and is made of a nonmagnetic material such as a thermosettable resin. The lower face of the duplicate molding SURM, intended to face the drum TAMB, comprises three adjacent plane faces: $F_1$, $F_2$, $F_3$; the face $F_2$ is between the faces $F_1$ and $F_3$, and the intersecting lines formed by the junction of planes $F_1$ and $F_2$, on the one hand and the junction of planes $F_2$ and $F_3$, on the other are parallel. The face Fl forms a dihedral angle $D_2$ with the face $F_3$, the latter forming a dihedral angle $D_2$ with the face $F_3$. The dihedral angle $D_1$ is larger than the dihedral angle $D_2$. This duplicate molding structure makes it possible for the assembly formed by the duplicate molding and the transducer TEC to be tangent to the drum TAMB vertically of the writing pole POLE. Hence this writing pole is in permanent contact with the surface of the drum TAMB.

Figure 4:
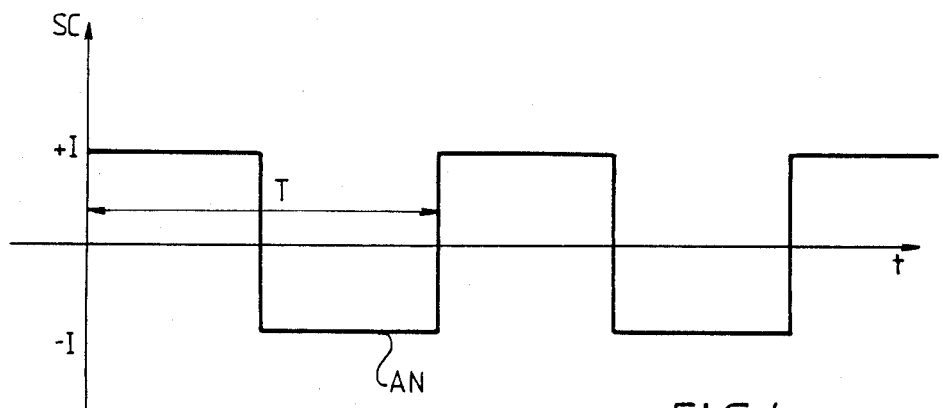
FIG. 4 is a time diagram showing the writing current furnished by the writing current generating means.
Figure 5:
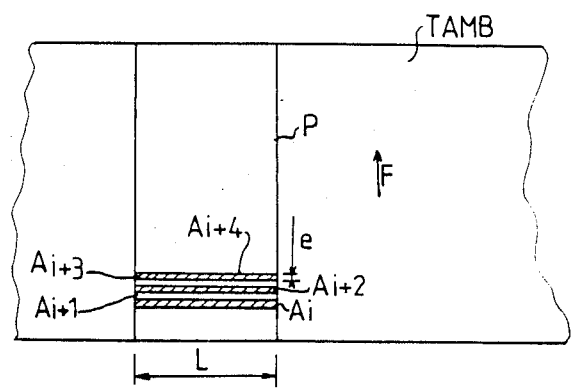
FIG. 5 shows a recording track of the drum on which a plurality of magnetic domains of successive positive and negative magnetization are recorded.

During the writing operations, the microprocessor MICROP transmits a writing control current CE in digital form to the writing current generating means MGCE, which converts this digital control current to an analog writing current SC, for instance of square form as shown in FIG. 4. The period of this writing current SC equals T, and its amplitude equals I. The current SC is alternatively positive and negative in succession, and its intensity accordingly varies between $-I$ and $+I$.

The writing current SC is fed to the winding BOBEC of the writing transducer TEC.

The function of the dynamic magnetometer MD according to the invention is governed by the method described below in conjunction with Figs. 1, 4, 5 and 6.

It is assumed that a given track P of the drum, which rotates at a uniform rotational speed V in the direction of the arrow F, for example on the order of 30 revolutions per minute, is to be magnetically characterized.

Figure 6:
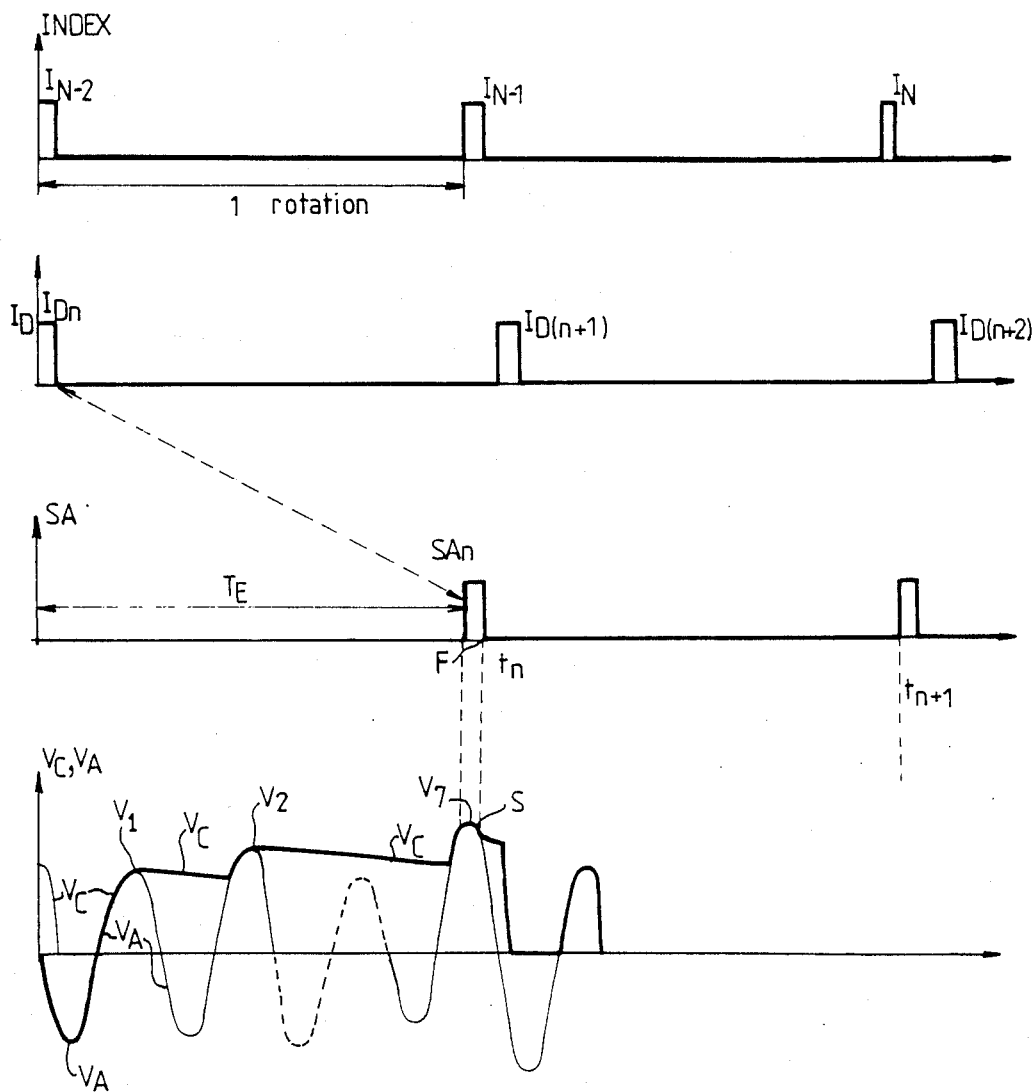
FIG. 6 is a time diagram of signals illustrating the functioning of the apparatus for performing the method of the invention shown in FIG. 1 and 3.

Upon each revolution, when the index IND travels past the locating means MIND, these means furnish a pulse $I_N$ of rectangular form. Thus as FIG. 6 shows, the means MIND furnish a pulse train $I_{N-2}$, $I_{N-1}$, $I_N$, $I_{N+1}$, . . . ; the duration between each of these pulses equals the duration of rotation for one drum revolution.

Pulse $I_{N-2}$ will be taken as an example.

As soon as it returns to 0, the sequence $SEQ_1$ of the three following operations begins:

(1) ERASING OPERATION:

As soon as this pulse $I_{N-2}$ arrives at the microprocessor MICROP, the microprocessor sends an erasure control signal CEF to the erasing generator GEF. This generator, then, in response to the current CEF, transmits an erasing current $I_{ER}$ to the winding BOBL of the erasing transducer TEFL. The erasing current may be either a direct current, of intensity for instance equal to 150 mA, or an alternating current, for example with a frequency of 7 kHz and an amplitude of 150 mA. The erasure of the track P of the drum takes place for one complete revolution of the drum, that is, until the means for locating the index MIND furnished the pulse that follows the pulse $I_{N-2}$, or in other words the pulse $I_{N-1}$. The essential result of this erasure is that the magnetic recording layer of the drum is made magnetically neutral (with 0 magnetization inside the layer).

As soon as the microprocessor MICROP receives the pulse $I_{N-1}$, the operation of writing the information on the track P of the drum then begins.

(2) WRITING OPERATION:

The microprocessor MICROP transmits a writing control signal CE to the means MGCE. The latter means convert the writing control current CE, which is written in digital form, into a square current SC (see FIG. 4 and the above description). The writing transducer TEC then writes a succession of rectangular magnetic domains on the track P that substantially has the dimension of the cross section of the writing pole POLE. A succession of magnetic domains is thus attained, in which the magnetization is successively positive and negative; that is, the domains $A_i$, $A_{i+1}$, $A_{i+2}$, $A_{i+3}$, $A_{i+4}$, . . . , are produced, with the magnetic domains $A_i$, $A_{i+2}$, $A_{i+4}$, having positive magnetization, for example, while the domains $A_{i+1}$, $A_{i+3}$, . . . have negative magnetization (see FIG. 5). The magnetization in these domains is perpendicular to the surface of the drum. It can be seen that the track P is written over a width L, since each of the written domains has a length equal to e, measured parallel to the direction of travel F of the drum. The first writing operation that is performed over the course of time is effected for a current SC the amplitude I of which equals $I_1$, where $I_1$ is not 0 but is close to 0 (see FIG. 6). $I_1$ can for instance be selected to be equal to 1 mA.

When the locating means MIND furnish the pulse $I_N$, the writing operation is completed. It should be noted that during this writing operation, the reading means ML are disabled. As soon as the microprocessor MICROP receives the pulse $I_N$, the reading operation begins.

(3) READING OPERATION:

The microprocessor MICROP then transmits a reading control signal CL to the reading means ML, which can now function. The winding BOBL of the reading transducer TEFL then furnishes the signal $v_A$ to the reading means ML. This signal $v_A$ is a periodic signal, the period of which equals T. It has a substantially sine-wave form, having a succession of positive and negative alternations, and the amplitude of the positive alternations is successively $V_1$, $V_2$, . . . , $V_n$. As soon as the microprocessor has received the pulse $I_N$, it furnishes a sampling pulse train $SA_n$, $SA_{n+1}$, . . . to the means ML, the sampling period $T_E$ of which is equal to several times the period T, for example seven times, in a preferred embodiment of the invention. (It will be understood that as for FIG. 6, the time scale is different for the signals $I_N$, on the one hand, and $I_{Dn}$, $SA_n$ and $V_A$, on the other.) As soon as the reading means ML receive one of the sampling pulses $SA_n$, $SA_{n+1}$, ..., they sample the value of the positive amplitude of the signal $v_A$ at time $t_n$ when the pulse $SA_n$ is emitted, and converts this into a digital signal $S_1$, which is transmitted to the memory MEMO. The digital signal $S_1$ is formed for example by a set of 10 logic bits equal to 0 or 1. In an example of digital application of the invention, with the drum having a circumference of 314 mm (diameter = 100 mm), the length e of a magnetic domain being 0.1 mm, it can be seen that per revolution there are 1570 pairs of positive and negative magnetic domains such as $A_i - A_{i+1}$, and that consequently the signal $V_A$ includes 1570 periods. Since TE is substantially equal to 7 T, it can be seen that per sampling, more than 200 values for $S_1$ can be sampled, which will be transmitted to the memory MEMO, for the same revolution of the drum and for the same value of $I_1$.

The microprocessor MICROP includes a calculating program which enables it to extract, from among the 200 points measured, the maximum value $SM_1$, the minimum value $S_{ml}$ and the mean value of the set of values Sl picked up in a single revolution of the drum.

As soon as the reading operation is completed, or in other words as soon as the means MIND furnish the index pulse $I_{N+1}$, then a second sequence $SEQ_2$ of three operations begins, but with a writing current $I_2$, such that:

$$I_2 - I_1 = \Delta I.$$

The sequence of operations $SEQ_2$ elapses in the same order as before; that is, erasure, writing, and reading, in succession. Thus three signal values are obtained, $S_{M2}$, $S_{a2}$, and $S_{m2}$, which correspond to the value of the current $I_2$.

As soon as the sequence SEQ2 ends, the sequence $SEQ_3$ begins, which is identical to the two sequences preceding it but for a current $I_3$, where $I_3 - I_2 = \Delta I$, with signal values $S_{M3}$, $S_{a3}$, $S_{m3}$.

Next, in the same manner, a succession of operating sequences $SEQ_4$, $SEQ_5$, ... is performed, until the operating sequence $SEQ_p$, in which p depends on the desired precision for defining the curve $S = f(I)$. $I_p$ is the value for I at which the saturation magnetization of the magnetic layer is obtained. It is clear that the value of $\Delta I$ depends on the values of $I_p$ and p. In practice, $\Delta I$ is on the order of 1 at about 10 mA.

Corresponding to the set of values $I_1$, $I_2$, $I_3$, $I_4$..., $I_p$ are three sets of values: a first set $S_{M1}$, $S_{M2}$, ..., $S_{Mp}$; a second set $S_{a1}$, $S_{a2}$, ..., $S_{ap}$; and a third set $S_{m1}$, $S_{m2}$, ..., $S_{mp}$.

Figure 9:
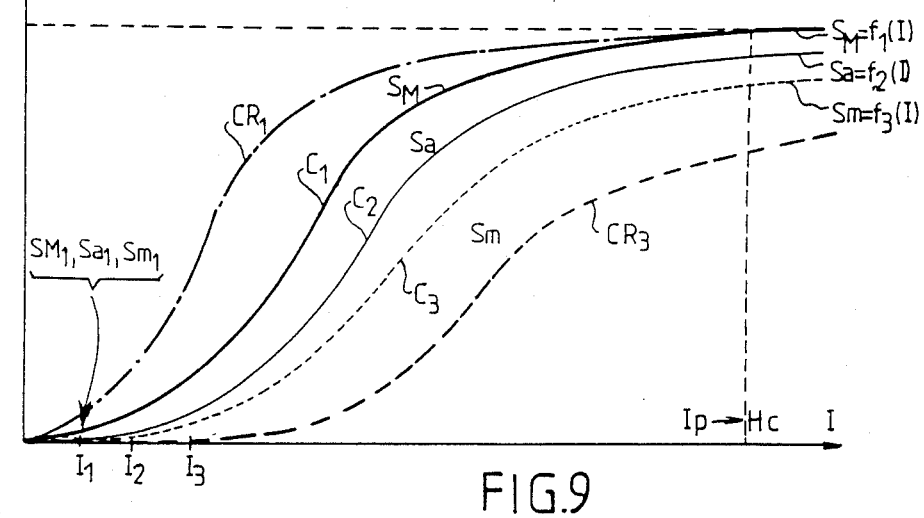
FIG. 9 shows the various characterization curves obtained.

Corresponding to these three sets are three curves of primary magnetization $S_M = f_1(I)$, $S_a = f_2(I)$, $S_m = f_3(I)$, these curves being identified as $C_1$, $C_2$ and $C_3$ and shown in FIG. 9.

The curves $S = f(I)$ are representative, to a near constant, of the curve of primary magnetization $M = f(H)$, where M is the magnetization inside the recording material and H is the magnetic field applied at the time of the writing operation. In effect, H is proportional to I, and M is proportional to S.

These curves can be displayed directly on a computer terminal screen, this computer including the microprocessor MICROP.

It will be understood that for the same current I, the variations of S for the same revolution can be picked up, which is also known as modulation of reading over one revolution, which makes it possible to verify the homogeneity of the magnetic characteristics of the recording layer over one revolution.

Turning now to a reference magnetic drum, the magnetic characteristics of which are considered optimal, and considering the three curves $C_1$, $C_2$, $C_3$ relating to this reference drum and known as $CR_1$, $CR_2$, $CR_3$, the curves at the extremes, $C_{R1}$ $C_{R3}$, comprise an envelope, and all the curves $C_1$, $C_2$, $C_3$ of all the drums the magnetic characteristics of which are to be measured by an apparatus according to the invention must be located inside this envelope. Hence the comparison between the various curves can be done directly at the computer screen. The characterization of a magnetic drum by means of the apparatus according to the invention takes place, as noted above, as soon as the various steps in the manufacture of the drum have been completed, and this can be done before and/or after the chromium-plating of the drum.

Turning now to FIGS. 3a and 3b, FIG. 3a shows that the writing current generating means MGCE comprise a digital/analog converter CDAE and a current generator CGE connected in series. The digital/analog converter CDAE receives the digital writing control signal CE, which is a set of eight logic bits equal to 0 or 1, indicating both the amplitude and the frequency of the square signal SC. Corresponding to this set of binary values transmitted by the microprocessor MICROP, at the output of the digital/analog converter CDAE, is a voltage pulse train VCE converted into a current pulse train by the current generator GCE. The current generator accordingly furnishes the square signal SC shown in FIG. 4, which has the desired amplitude I and the frequency. The frequency of this current is selected such that the length e of a written datum will be equal to or greater than 0.1 mm.

The reading means ML include the following, connected in series:
the preamplifier AMP,
the bandpass filter FILT,
the data acquisition voltmeter VAD,
the analog/digital reading converter CADL.

The signal $v_A$ emitted by the winding BOBL of the reading transducer TEML is transmitted to the input of the preamplifier AMP and amplified by it, becoming the signal $V_A$, which is transmitted to the input of the filter FILT of the capacitance switching type, for example an NS (National Semiconductors) MF10 filter, and which leaves this filter in the form of a substantially sine-wave reading signal the frequency of which is strictly equal to the frequency of the writing current. It can be seen that the role of the filter, which is calibrated to the frequency of the writing current, is to eliminate all the harmonics and all the parasitic signals from the signal $V_A$. The signal $V_A$ thus gaving passed through the filter is transmitted to the input of the data acquisition voltmeter VAD, the essential constituent functional elements of which are shown in FIG. 3b.

The data acquisition voltmeter VAD is in fact an analog peak voltmeter.

It includes:
a comparator COMP having a positive input $E_p$ and a negative input $E_N$,
a diode DI,
a capacitor CAP to the terminals of which are connected in parallel a resistor R on the one hand and a switch INT, for example a transistor switch, on the other.

The common terminal (not connected to ground) of the capacitor CAP, the resistor R and the switch INT is also connected to the negative input $E_N$ of the comparator COMP and to the cathode of the diode DI. Their other common terminal is connected to ground. The volta $V_A$ is applied to the positive input $E_p$ of the comparator COMP, the output of which is connected to the anode of the diode DI.

The function of the peak voltmeter VAD will be understood from FIG. 6.

The voltage $V_C$ at the terminals of the capacitor CAP develops in the manner indicated in FIG. 6, as will be described in detail below.

As soon as the index pulse $I_N$ is transmitted to the microprocessor MICROP, the microprocessor transmits a discharge signal $I_{Dn}$ to the switch INT, which closes. The capacitor CAP discharges rapidly (with a duration on the order of that of the pulse $I_{Dn}$, which in turn is less than that of one-half an alternation of the signal $V_A$). In FIG. 6, it has been assumed for simplification of both the drawing and the discussion that this discharge takes place during a negative alternation of the signal $V_A$. Hence the voltage $V_C$ is 0 at the end of the discharge.

Once the pulse $I_{Dn}$ returns to 0, the switch INT opens. As soon as the first positive alternation of the signal $V_A$ then appears, the diode DI is conducting (since $V_A > V_C$) and the capacitor charges until its voltage at the terminals $V_C$ is equal to the peak voltage $V_1$ of this alternation. Next, when $V_A$ becomes less than $V_C$, the diode DI is no longer conducting, and the capacitor CAP then discharges across the resistor R, quite slowly; the discharge period $T_D$, which is equal to the product of R and the capacitance of the capacitor CAP, is on the order of 100 times the period T. As soon as the voltage $V_A$ is again greater than $V_C$, the diode DI conducts and the capacitor CAP charges again, until as shown in FIG. 6 its voltage $V_C$ at the terminals is equal, for instance, to the peak voltage $V_2$ of the second positive alternation. As soon as $V_A$ again becomes less than $V_2$, the capacitor CAP discharges again across the resistor R (the diode DI no longer conducts), until $V_A$ again becomes greater than $V_C$, which is the case for the seventh alternation shown in FIG. 6, where $V_C$ again becomes equal to the peak voltage $V_7$ of that alternation.

At time $t_n$, the sampling pulse $SA_n$ is transmitted to the converter CADL, which then picks up the analog voltage $V_C$ (which is practically equal to $V_7$ in FIG. 6), and converts it into a digital signal, for instance having 10 bits $D_0-D_9$, which comprise the signal S transmitted to the memory MEMO.

When the discharge pulse $I_{D(n+1)}$ is applied to the switch INT, the capacitor CAP discharges across this switch, and its voltage at the terminals $V_C$ drops back to 0. The cycle then begins again, analogously to what has just been described above, for the period of time between the appearance of the $I_{Dn}$ and the appearance of the pulse $SA_n$.

Figure 7:
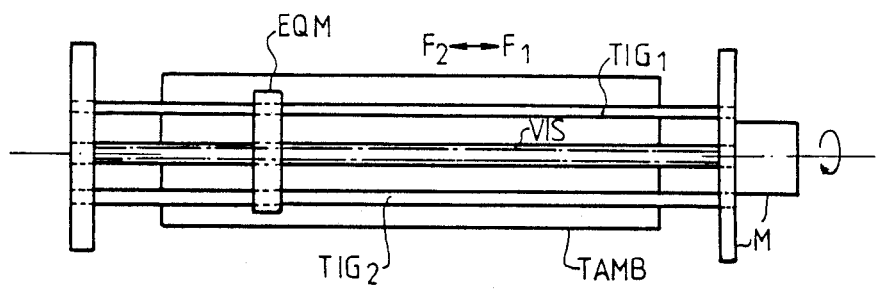
FIGS. 7 and 8, which are views from above and in section, respectively, show a preferred embodiment of the apparatus according to the invention with which the entire recording surface of a magnetic drum for a magnetographic printer can be magnetically characterized.
Figure 8:
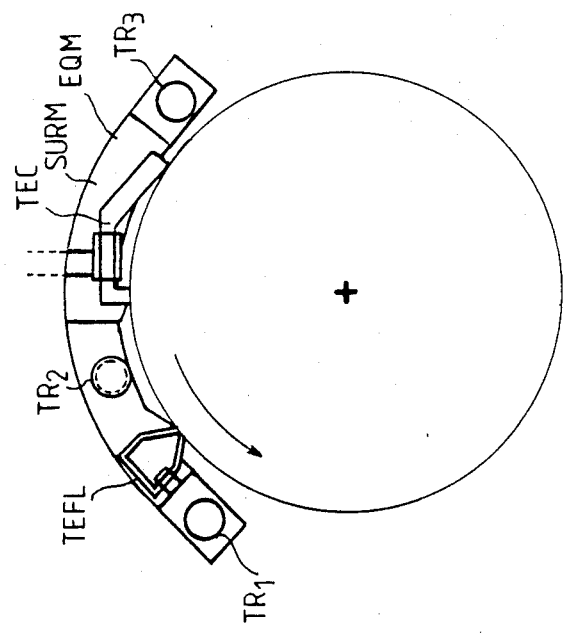

Turning now to FIGS. 7 and 8, a preferred exemplary embodiment is shown of the dynamic magnetometer according to the invention. In this embodiment, the writing transducer TEC and its duplicate molding SURM (see FIG. 2), and the erasing and reading transducer TEFL are mounted on the same transducer support arm, that is, EQM, which is movable in a direction parallel to the generatrices of the drum TAMB. The arm EQM is displaced in the directions $F_1$ or $F_2$, as shown in FIG. 7. It is for instance made of the same material as that comprising the duplicate molding SURM. It is provided with two holes $TR_1$ and $TR_2$, inside which two cylindrical rods $TIG_1$ and $TIG_2$ move, the axis of the rods being parallel to the generatrices of the drum, and on which rods the movable carriage slide so as to be displaced from one track P to neighboring tracks. The arm EQM is also provided with a threaded hole $TR_2$, inside which an endless screw VIS passes that is integrally connected to the driveshaft of a motor M, for example a stepping motor, the step of which equals the width L of the tracks P of the drum. Thus by means of the motor M and the threaded screw VIS engaging the inside of the threaded hole $TR_2$, the head-carrying arm EQM is capable of being displaced along the drum TAMB in a direction parallel to the generatrices of the drum, and accordingly it is possible to magnetically characterize each track P of the drum TAMB.

We claim:

1. A method for ascertaining the magnetic characteristics of primary magnetization of the recording layer of a movable magnetic information carrier including a plurality closed recording tracks P each having a synchronization index (IND) located by locating means (MIND) which furnish a synchronization pulse ($I_{N-2}$, $I_{N-1}$, $I_N$, ...) upon each passage of the index past them, characterized in that for each track, a succession of p distinct sequences $SEQ_1$, $SEQ_2$, ..., $SEQ_{j+1}$, $SEQ_p$ is effected, where j is an entire number equal to 1, 2 ... p and where all successive sequences $SEQ_j$ include four successive operations a, b, c, d, each sequence $SEQ_j$ occurring just once when the last operation of preceding sequence $SEQ_{j-1}$ is completed the four successive operations being:

(a) magnetically erasing the layer over the entire surface of the track upon the reception of a first synchronization pulse ($I_{N-2}$), to make its magnetic state neutral;

(b) producing a magnetic field H by a periodic writing current SC of a predetermined amplitude $I_j$ and a predetermined frequency which is the same for each sequence, the succession of amplitudes $I_1$, $I_2$, $I_j$ ... $I_p$ being of increasing order the absolute value of amplitude $I_j$ being greater than the absolute value of $I_{j-1}$ (Sequence $SEQ_{j-1}$) and such that $|I_j| - |I_{j-1}| = \Delta I$ where $\Delta 1 > 0$, $I_p$ being the value of $I_j$ at which the magnetic layer is saturated and p defines the precision required for defining the primary magnetization curve and $I_1$ being the value closest to 0;

(c) writing by means of said magnetic field H a succession of magnetic domains ($A_i$, $A_{i+1}$, $A_{i+2}$) on the entirety of said surface upon the reception of a second synchronization pulse ($I_{N-1}$); and (d) reading a voltage S which is a function of the magnetization M inside of each of the domains read at these times, thus obtaining a plurality of values of S for the same value $I_j$, upon the reception of a third synchronization pulse ($I_N$), at predetermined sampling times ($t_n$, $P_{n+1}$, ... ), with a predetermined sampling period $T_E$ greater than the period T of the writing period where T is proportional to the length of each magnetic domain measured parallel to the direction of travel of the carrier and the inverse of the speed of the carrier.

2. A method as defined by claim 1, characterized in that $I_{j+1} = I_j + \Delta I$, where $\Delta I$ is a function of the values $I_p$ and p.

3. A method as defined by claim 1, further including extracting from the set f values of (S) corresponding to each value $I_j$ the maximum value $S_{Mj}$ and the minimum value $S_{mj}$, thus obtaining a maximum curve of primary magnetization including the set of maximum values $S_{M1}, S_{M2}, \ldots, S_{Mj}, \ldots, S_{Mp}$, and a minimum curve of primary magnetization including the set of minimum values $S_{m1}, \ldots, S_{mj}, \ldots, S_{mp}$, wherein said maximum and minimum curves are represented as a function of the values $I_1, I_j, \ldots, I_p$ on the suitable display device.

4. A method as defined by claim 2, further including the step of extracting from the set of values of (S) corresponding to each value $I_j$, the maximum value $S_{mj}$ and the minimum value $S_{mj}$, thus obtaining a maximum curve of primary magnetization including the set of maximum values $S_{M1}, S_{M2}, \ldots, S_{mj}, \ldots, S_{Mp}$, and a minimum curve of primary magnetization including the set of minimum values of $S_{m1}, \ldots, S_{mj}, \ldots, S_{mp}$, wherein said maximum and minimum curves are represented as a function of the values $I_1, I_j, \ldots, I_p$ on the suitable display device.

5. A method as defined by claim 3, further including the step of comparing the maximum, mean and minimum curves with the maximum, mean, minimum reference curves $C_R1$, $C_{R2}$, $C_{R3}$ of a reference magnetic carrier.

6. A method as defined in claim 4, further including the step of comparing the maximum, mean and minimum curves with the maximum, mean, minimum reference curves $C_{R1}$, $C_{R2}$, $C_3$ of a reference magnetic carrier.

7. A dynamic magnetometer for ascertaining the magnetic characteristics of primary magnetization of the recording layer of a movable magnetic information carrier including a plurality of closed recording tracks P each having a synchronization index (IND) located by locating means (MIND) which furnish a synchronization pulse $(I_{N-2}, I_{N-1}, I_N, \ldots)$ upon each passage of the index past them, characterized in that for each track, a succession of ap distinct sequences $SEQ_1, SEQ_2, \ldots, SEQp_{j+1}$, SEQ p is effected, where j is a whole number dual to 1, 2 . . . p and where all successive sequences $SEQ_j$ include four successive operations a,b,c,d, each sequence $SEQ_j$ occurring just once when the last operation of preceding sequence $SEQ_{j-1}$ is completed, the four successive operations being:

(a) magnetically erasing the layer over the entire surface of the track upon the reception of a first synchronization plus $(I_{N-2})$, to make its magnetic state neutral;

(b) producing a magnetic field H by a periodic writing current SC of a predetermined amplitude $I_j$ and a predetermined frequency which is the same for each sequence, the succession of amplitudes $I_1, I_2, I_j \ldots I_p$ being of increasing order, the absolute value of amplitude $I_j$ being greater than the absolute value of $I_{j-1}$ (Sequence $SEQ_{j-1}$) and such that $|I_j| - |I_{j-1}| = \Delta I$ where $\Delta I > 0$, $I_p$ being the value of $I_j$ at which the magnetic layer is saturated, p defines the precision required for defining the primary magnetization curve and $I_1$ being the value closest to 0 and writing by means of said magnetic field of a succession of magnetic domains $(A_{i+1}, A_{i+2})$ on the entirety of said surface upon the reception of a second synchronization pulse $(I_{n-1})$;

(c) reading a voltage S which is a function of the magnetization M inside of each of the domains read at these times, thus obtaining a plurality of values of S for the same value $I_j$, upon the reception of a third synchronization pulse $(I_N)$, at predetermined sampling times $(t_n, P_{n+1}, \ldots)$, with a predetermined sampling period $T_E$ greater than the period T of the writing period where T is proportional to the length of each magnetic domain measured parallel to the direction of travel of the carrier and the inverse of the speed of the carrier; and (d) memorizing the values of S and the values of $I_j$ and extracting from this set at least the mean value $S_{aj}$ of S, and representing on a display device the mean curve of primary magnetization including the set of mean values $S_{a1}, \ldots, S_{aj}$, Sap as a function of the values $I_1, I_j, \ldots, I_p$ as soon as the sequence $SEQ_p$ is comleted, said magnetometer comprising means (MIND) for locating the synchronization index (IND) emitting a synchronization pulse $(I_{N-2}, I_{N-1}, I_N)$ for each of the constituent operations of the sequence $(SEQ_j)$, when index (IND) is located; said magnetometer comprising a generator for providing an erasing current (GEF);

a transducer (TEFL) connected to said generator;

generating means (MGCE) for providing a writing current (SC) a transducer (TEC) for writing domains on one track of said plurality of tracks P, said transducer being connected to said generating means (MGCE);

transducer means (TEFL) for reading the domains recorded on the track and transmitting the analog signal to:

reading means (ML) for furnishing the voltage S at said sampling times;

memorizing means (MEMO) for memorizing the corresponding values of S for each value of $I_j$, connected to said current generating means (MGCE) and reading means (ML);

calculating means for calculating each value of $I_j$, the mean value $S_{aj}$ and the maximum and minimum values $S_{Mj}$ and $S_{mj}$; and a means for displaying curves of maximum, mean and minimum primary magnetization.

8. An apparatus as defined by claim 15 characterized in that it includes a programmable control device (MICROP) receiving the synchronization pulses $(I_{N-2}, I_{N-1}, I_N)$.

9. An apparatus as defined in claim 7 characterized in that it includes a programmable control device (MICROP) receiving the synchronization pulses $(I_{N-2}, I_{N-1}, I_N)$ and successively controlling the operations of erasure, writing and reading when it receives three successive pulses $(I_{N-2}, I_{N-1}, I_N)$.

10. An apparatus as defined by claim 8 characterized in that it includes a programmable control device (MICROP) receiving the synchronization pulses $(I_{N-2}, I_{N-1}, I_N)$ and successively controlling the operations of erasure, writing and reading when it receives three successive pulses $(I_{N-2}, I_{N-1}, I_N)$.

11. An apparatus as defined by claim 9, characterized in that the programmable control device includes the memorization means (MEMO) and a program for calculating the maximum, mean and minimum values.

12. An apparatus as defined by claim 10, characterized in that the programmable control device includes the memorization means (MEMO) and a program for calculating the maximum, mean and minimum values.

13. An apparatus as defined in claim 7, characterized in that the writing current generating means (MGCE) includes
- a digital/analog converter (CDAE), and
- a current generator (GCE) connected in series, the converter being connected to receive a digital writing control signal (CE) and then transmit voltage pulses (VCE) to the current generator, which converts said voltage pulses into a current pulse train forming the signal (SC) transmitted to the data writing transducer (TEC).

14. An apparatus as defined by claim 7, characterized in that the reading means (ML) include
- a preamplifier AMP,
- the bandpass filter FILT,
- the data acquisitionn voltmeter VAD,
- the analog/digital converter CADL, connected in series, the preamplifier being connected to receive the reading signal ($V_A$) furnished by the reading transducer OTEFL), the filter being calibrated to the frequency ($f_E$) of the writing current, the data acquisition voltmeter being connected to determine the mean peak value of the periodic reading signal ($V_A$) and on command of the control device (MICROP) to transmit said mean value at the predetermined sampling time ($t_n$, $t_{n+1}$) to the analog/digital converter, which transmits the signal (S) to the memorization means (MEMO).

* * * * *

UNITED STATES PATENT AND TRADEMARK OFFICE
CERTIFICATE OF CORRECTION

PATENT NO. : 4,978,916
DATED : December 18, 1990
INVENTOR(S) : Christian Combettes, et al It is certified that error appears in the above-identified patent and that said Letters Patent is hereby corrected as shown below:

Col. 11, line 45 (claim 7) "ap" should be --p--.

Col. 12, line 49 (claim 8) "claim 15" should be --claim 7--.

Col. 14, line 10, "OTEFL)" should be --(TEFL)--.

Signed and Sealed this

Twenty-second Day of September, 1992

Attest:

DOUGLAS B. COMER

*Attesting Officer*  *Acting Commissioner of Patents and Trademarks*